United States Patent
Pan

(10) Patent No.: US 7,145,390 B2
(45) Date of Patent: Dec. 5, 2006

(54) DIFFERENTIAL POWER AMPLIFIER AND METHOD IN CLASS AB MODE

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 11 days.

(21) Appl. No.: 10/953,362

(22) Filed: Sep. 30, 2004

(65) Prior Publication Data

US 2006/0049874 A1    Mar. 9, 2006

Related U.S. Application Data

(60) Provisional application No. 60/606,928, filed on Sep. 3, 2004.

(51) Int. Cl.
*H03F 3/45* (2006.01)

(52) U.S. Cl. .................................................. 330/261
(58) Field of Classification Search ............... 330/252, 330/261
See application file for complete search history.

(56) References Cited

U.S. PATENT DOCUMENTS 6,366,166 B1 * 4/2002 Belot .......................... 330/252
2006/0028275 A1 * 2/2006 Bhattacharjee et al. ..... 330/254

* cited by examiner

*Primary Examiner*—Robert Pascal
*Assistant Examiner*—Hieu Nguyen
(74) *Attorney, Agent, or Firm*—Squire, Sanders & Dempsey, LLP.

(57) ABSTRACT

The invention enables an increase in linearity of a power amplifier while reducing current consumption by supplying a bias current to the power amplifier in a Class AB mode.

19 Claims, 5 Drawing Sheets

$w=1/\mathrm{SQRT}(LC)=2*PI*2.5\mathrm{GHz}$
$Q=2*pi*2.5\mathrm{GHz}*L/R=7$
$L=1.8e-9$
$R=4$
load seen by Op, On=$Q*Q*R\sim 200$ $w = 1/\sqrt{LC} = 2 \pi \cdot 2.5\text{GHz}$
$Q = 2\pi \cdot 2.5\text{GHz} \cdot L/R = 7$
$L = 1.8\text{e}{-9}$
$R = 4$
load seen by Op, On $= Q \cdot Q \cdot R \sim 200$ Ibias=30mA
Class A Ibias=30mA
Class A Ibias=15mA
Class AB Ibias=15mA
Class AB Ibias=10mA
Class AB Ibias=10mA
Class AB

DIFFERENTIAL POWER AMPLIFIER AND METHOD IN CLASS AB MODE

CROSS REFERENCE TO RELATED APPLICATION

This application claims priority to and incorporates by reference U.S. patent application Ser. No. 60/606,928, filed Sep. 3, 2004, entitled "DIFFERENTIAL POWER AMPLIFIER DESIGN IN CLASS AB MODE ACHIEVING IMPROVED LINEARITY" by inventor Meng-An Pan.

BACKGROUND

1. Technical Field

This invention relates generally to wireless communication systems, and more particularly, but not exclusively, to a non-match differential power amplifier driver (PAD) design achieving linearity of 15 dBm output 1 dB compression point with less current than the class A design case.

2. Description of the Related Art:

Communication systems are known to support wireless and wirelined communications between wireless and/or wirelined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

The IEE 802.11g standard uses Orthogonal Frequency Division Multiplexing (OF DM) modulation that has data information in both the amplitude and phase. In order not to degrade the modulation quality, the transmitter has to be operated 10 dB lower than the 1 dB compression point of the transmitter. That is, the operating output power backs off by 10 dB of its 1 dB compression point. The design target is to send out 5 dBm output power, which means the transmitter has to be linear up to 15 dBm. That is, the transmitter and thus the power amplifier driver (PAD) (the last stage of the transmitter) has to be designed with output 1 dB compression point equal to or more than about 15 dBm. A balun coupled to the PAD combines the differential signal and then sends it to a power amplifier if extra output power is required.

The design of a power amplifier driver (PAD) can be classified as class A, class AB, class B, class C, etc when biased at different current levels. Conventionally, class A design is believed to be the most linear design choice because the device under operation is always on and never off. However, as Class A consumes a large amount of current.

Accordingly, a method on how to bias a differential MOS device in the class AB mode to save current (less than the class A design case) and at the same time making sure the device input non-linearity does not fail the power amplifier driver's output 1 dB compression linearity design target is required.

SUMMARY

Embodiments of the invention enable a power amplifier to maintain linearity in output power based on input voltage while reducing the bias current required.

In one embodiment of the invention, a power amplifier comprises a differential pair and a differential inductor coupled to the differential pair and to a power supply. The differential inductor is not matched and the differential pair includes a bias transistor supplying a bias current to the amplifier in a Class AB mode.

In one embodiment of the invention, the method comprises presenting a load to a differential pair of the power amplifier; and supplying a bias current to the differential pair in a class AB mode. The differential pair is coupled to a differential inductor, which is coupled to a power supply and the different inductor is not matched.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
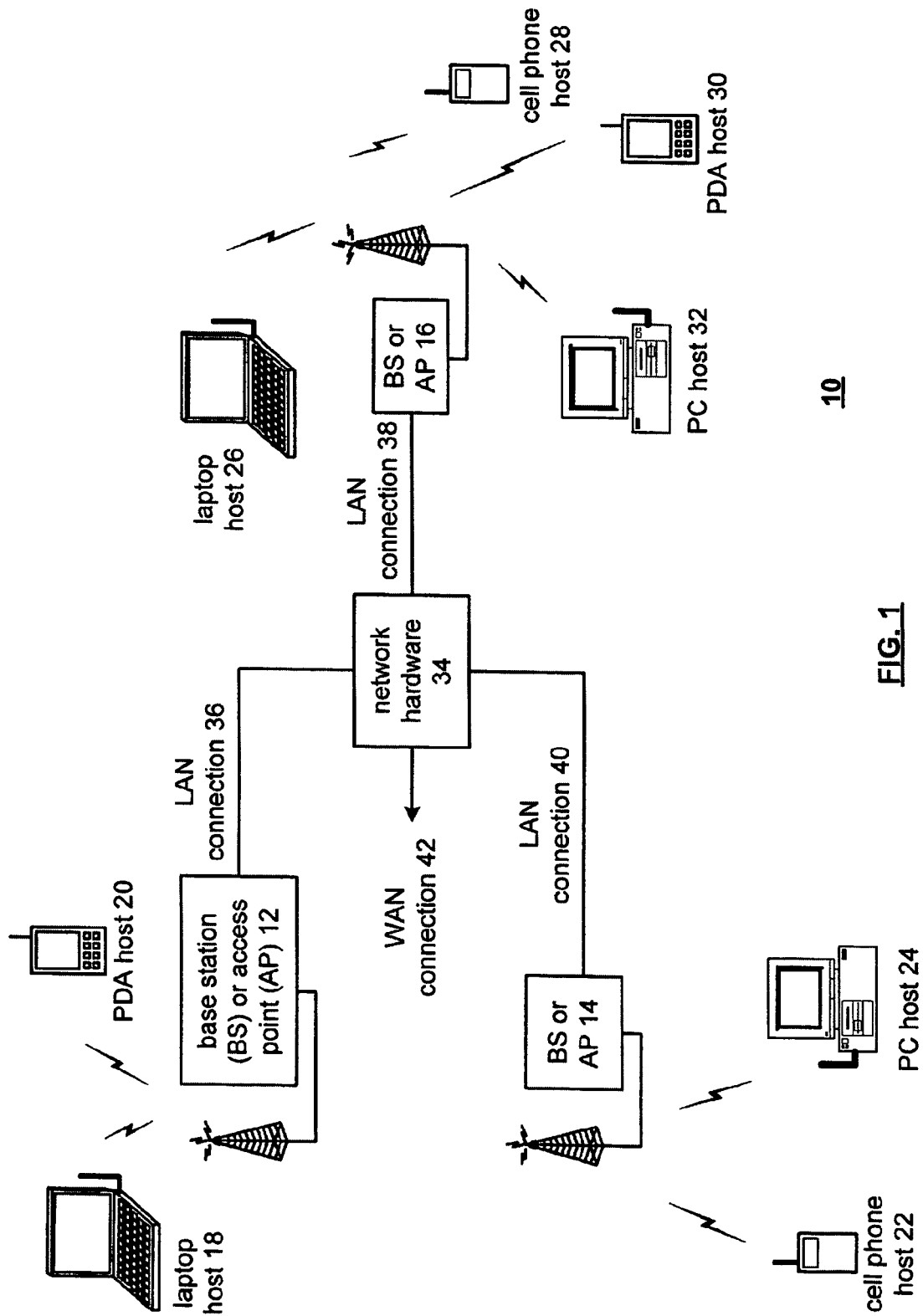
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power.

Figure 2:
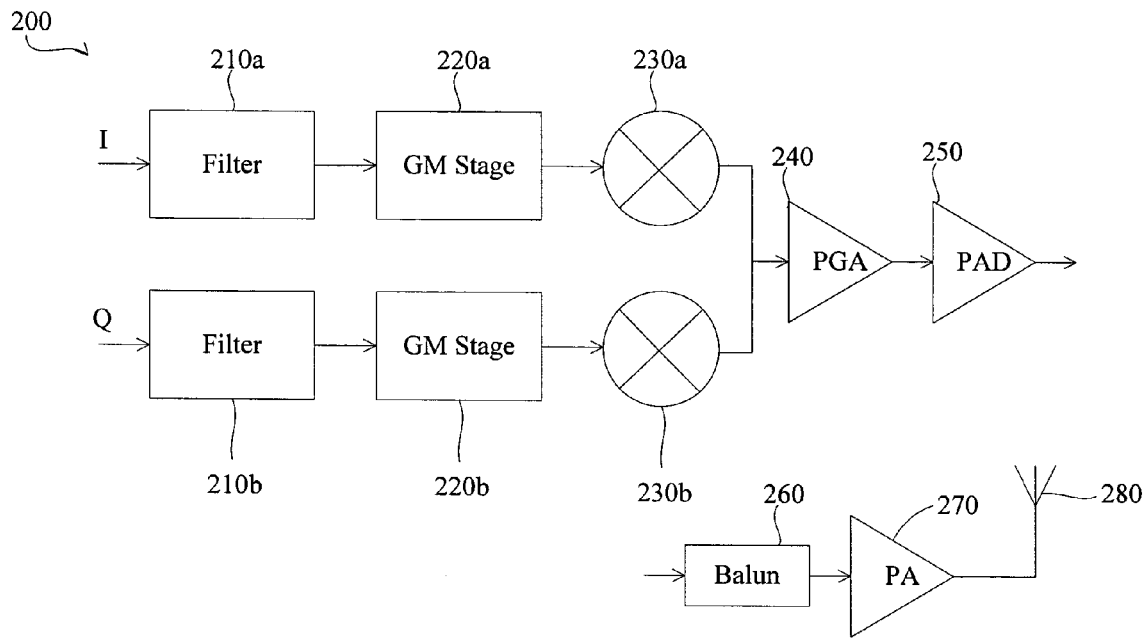
FIG. 2 is a block diagram illustrating a section of a transmitter.

FIG. 2 is a block diagram illustrating a section of a transmitter 200. The transmitter 200 includes digital to analog processing circuitry (not shown), communicatively coupled to I and Q branches. The I and Q branches each include a filter 210a and 210b respectively, a Gm stage 220a and 220b respectively and a mixer 230a and 230b respectively. The mixers 230a and 230b are communicatively coupled to a programmable gain amplifier (PGA) 240, which is communicatively coupled to a power amplifier driver (PAD) 250, which is communicatively coupled to a balun 260, which is communicatively coupled to a power amplifier 270, which is communicatively coupled to an antenna 280. The PAD 250 acts as a power amplifier (PA) and is referred to as a PAD to distinguish it from the PA 270.

After digital to analog processing, as is known in the art, the filters 210a and 210b, which may include low pass filters, filter the I and Q currents. The GM stages 220a and 220b then convert the voltage signals into current signals, which are up converted into 2.5 GHz signal via the mixers 230a and 230b in one embodiment. The PGA 240 provides the gain that amplifies the signals, and the PAD 250 then drives the balun 260 that combines the differential output signal into single ended signal. The balun 260 presents a load of 50 ohm to each side to the PAD 250. An external power amplifier 270 can be used if more output power (more than 5 dBm) is required.

Figure 3:
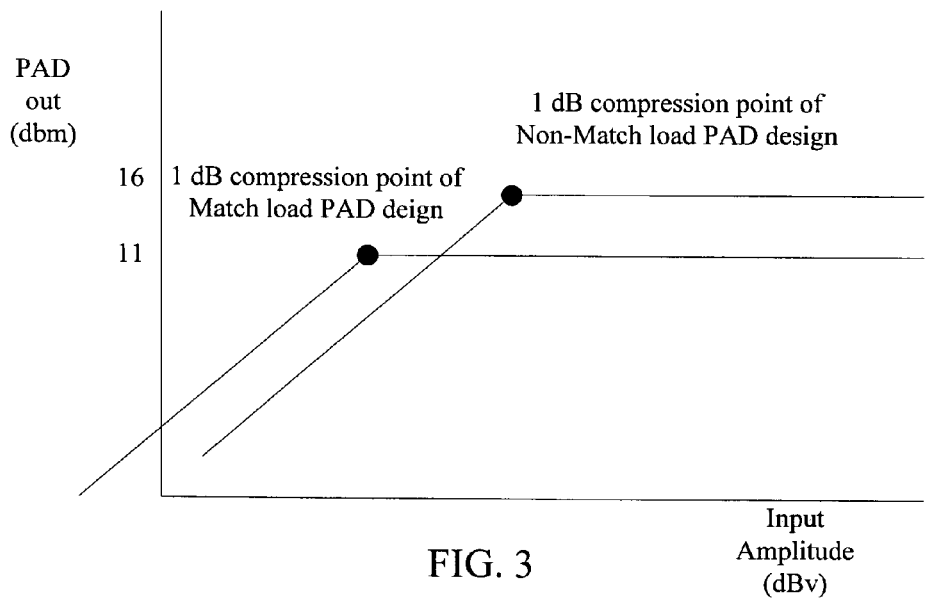
FIG. 3 is a graph illustrating linear output of a matched power amplifier driver versus an unmatched power amplifier driver of the transmitter.

FIG. 3 is a graph illustrating linear output of a matched PAD versus a non-matched PAD 250 of the transmitter 200. A conventional matched PAD only gives more output when the input signal is small but becomes output swing limited when the input gets stronger. Specifically, the conventional PAD's 1 db compression point is 10.5 dBm under this process/power supply. In contrast, the non-match (or unmatch) PAD 250 gives more linear output. Specifically, in one embodiment of the invention, the PAD 250 has a 1 db compression point of around 16 dBm under this process/power supply. The number 10.5 dBm and 16 dBm will be explained shortly.

Figure 4A:
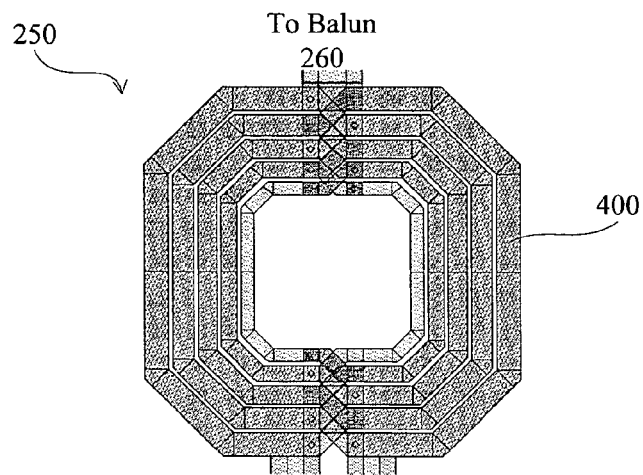
FIG. 4A and 4B are diagrams illustrating the power amplifier driver.
Figure 4A:
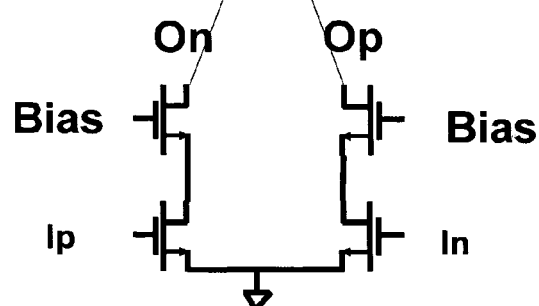
Figure 4B:
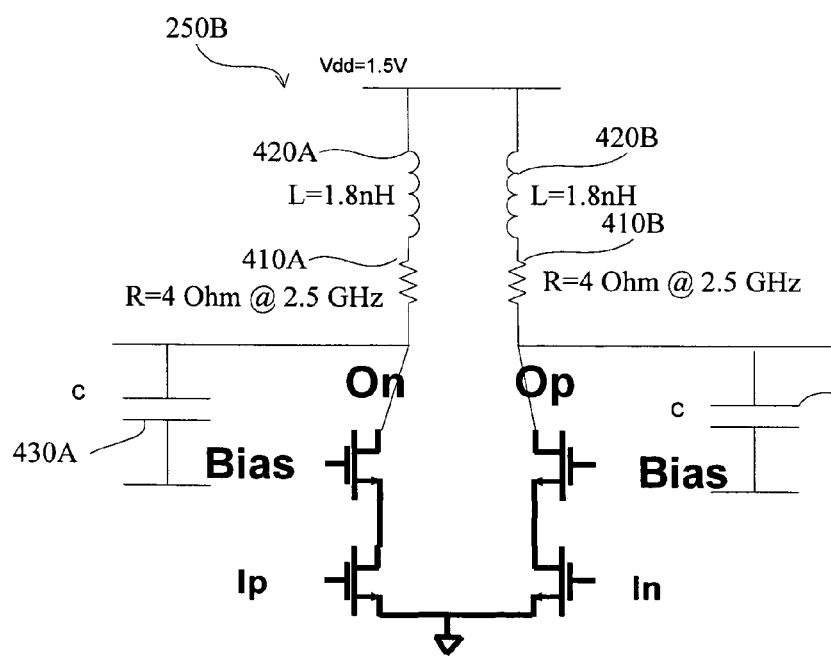

FIG. 4A and 4B are diagrams illustrating the power amplifier driver 250. The PAD 250 comprises a differential pair coupled to a differential inductor 400 via a bias transistor, wherein L is about 1.8 n and Q is about 7 to about 8. At about 2.5 GHz (the operating frequency, the transmitter band is around 2.5 GHz), the imaginary part of the impedance is 0 and the real part of the impedance is about 200. With the inductor tunes out whatever capacitive load at 2.5 GHz, the equivalent load seen by the PAD is an impedance of 200+j*0. That is the PAD output sees a load impedance with real part=200 and imaginary part=0. The bias transistor supplies a bias current to the power amplifier driver 250, as will be discussed in further detail below.

FIG. 4B is schematic of FIG. 4A. The differential inductor 400 comprises two branches, each branch having a resistor 410 (410A and B) coupled to an inductor 420 (420A and B) in series. The resistors 410 have a resistance of 4 Ohms at 2.5 GHz while the inductors 420 have an inductance of 1.8 nH. The top end of the inductors 420 are connected to a power supply=1.5 Volt for both sides. The resistors 410 A and B are also each coupled to a capacitor 430 A and B respectively.

The balun 260 will present a load of 50 ohm to the PAD 250. There will be signal coming out of the differential pair OP/ON (and sitting on top of the resistor 510 in FIG. 5). Power is defined as Pavg=Vamp*Vamp/2/R and R=50. That's where the power is (node 510 in FIG. 5). There is a AC coupling capacitor (cap) 430A and B between the PAD and the 50 ohm load. At frequency of 2.5 GHz, the impedance of this AC coupling cap is ~0. That is to say (in terms of signal at 2.5 GHz) before the AC cap and after the AC cap they are short. That is whatever signal appears before the AC cap will appear after the ac cap. That is, power after the AC cap=V*V/2/R equals the power before the AC cap which is the output of the PAD(OP/ON in FIG. 4A/B). That is to say the power at the output of PAD (OP/ON in FIG. 4A/B) is sent across the AC cap and arrives at the input of the balun 260 and gets combined.

Figure 5:
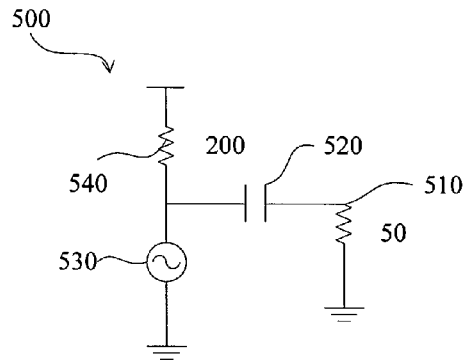
FIG. 5 is a diagram illustrating the electrical equivalent of a branch of the power amplifier driver.

FIG. 5 is a diagram illustrating the electrical equivalent of a branch 500 of the power amplifier driver 250. The branch 500 is equivalent to a branch of the PAD 250 of FIG. 4A and FIG. 4B. The power amplifier driver comprises of 2 branches (differential, one positive and one negative) with each branch having on-chip inductor 530 as the load and with a capacitor 520 interspersed between the on-chip inductor 530 and the resistors 510 and 540; the resistors are not matched. Because of LC tuning, only a resistor of 200 Ohms is left. The MOS transistor is equivalent to the signal source; the L will tune out whatever parasitic capacitor at the output at the operating frequency ~2.5 GHz and only z=200+j*0=200 left which is equivalent to a resistor load of 200 ohm. In contrast to a conventional power amplifier driver, the branch 500 is unmatched, i.e., there is no impedance matching between the 200 Ohm resistor and 50 Ohm resistor. In place of impedance matching circuitry is a capacitor so that the 50 Ohm load does not get transformed to 200 Ohm, thereby increasing the maximum Linear Power Out to 13 dbm per branch (accordingly, for 2 branches, the maximum linear output is 16 dbm). During operation, the balun 260 will present a load of 50 ohm to the PAD 250 (each side), and the power at the PAD 250 output is combined by the balun 260. At the PAD output there will be a total power of 16 dBm and the balun 260 just combines them into a single ended signal with the same power=16 dBm, and then sends it to the optional power amplifier for extra power if required. An optional power amplifier 270 is used if extra power (more than 5 dBm output) is required and then the signal is sent to the antenna 280.

This design is using a TSMC 0.18 process with power supply=1.8 v. Headroom for the MOS device ~1.5V. With a non-match load design: max linear output power each side~1.5*1.5/2/50=0.0225 W=22.5 mW. The max linear output power of two side combined~1.5*1.5/2/50*2=0.0225 W*2=45 mW=10*log 10(45)=16.5 dBm. In contrast, for a match load design: the max linear output power each side~1.5*1.5/2/200=0.005625 W=5.625 mW and the max linear output power of two sides combined~1.5*1.5/2/200*2=0.005625 W*2=11.25 mW=10*log10(11.25)=10.5 dBm.

Figure 6A:
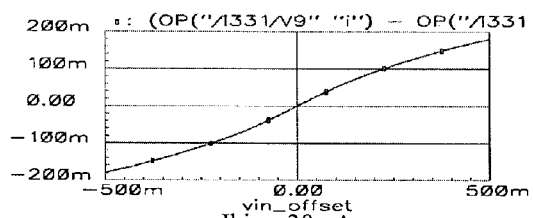
FIG. 6A and FIG. 6B are charts illustrating the operation of the PAD in class A mode at bias current of 30 mA per branch.
Figure 6B:
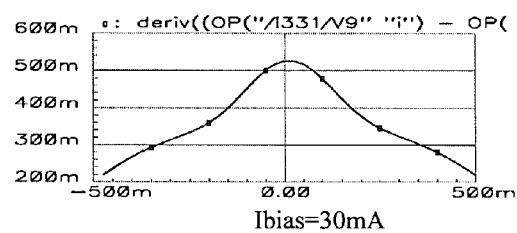

FIG. 6A and FIG. 6B are charts illustrating the operation of the PAD 250 in class A mode. Specifically, FIG. 6A is a chart illustrating differential output current (y axis) versus differential input voltage (x axis) and FIG. 6B is a chart illustrating the first derivative of the chart of 6A indicating linearity. For an ideal Gm stage (i.e., the differential output current is linearly proportional to input voltage) the slope should be constant. The bias current at each branch is 30 mA giving a total current consumption of 60 mA. As can be seen from the chart of FIG. 6B, which illustrates the slope of the line from FIG. 6A, (i.e., illustrates Gm—the derivative of FIG. 6A), the derivative is not constant. This means the differential pair will generate distorted (compressed) output current when input is getting larger and larger. This will lead to earlier output 1 dB compression point of the power amplifier. The 1 dB compression point of this power amplifier bias with 30 mA each branch is about 15.7 dBm. Since the design target is 15 dBm, the class A design is still an acceptable choice.

As is illustrated in FIG. 6A and FIG. 6B, the headroom for the drain of the PAD 250 is 1.5 V and the load is 50 Ohm. For Class A operation, each branch of the PAD 250 is biased with a direct current of 30 mA (1.5/30). When the PAD 250 is outputting 15 dBm, there will always be some bias current in the PAD 250. Accordingly, the PAD 250 is always on and never off. See Table I for linearity of the PAD 250 when the current is 30 mA per branch.

TABLE I

Linearity at 30 mA/Class A

| in_mv | pa_mv | vout_mv | pa_gain_db | vout_gain_db | pa_dbm | vout_dbm | idc_mA | phase |
|---|---|---|---|---|---|---|---|---|
| 1.00E−03 | 7.92E−03 | 1.11E−02 | 18.0 | 14.9 | −29.0 | −29.1 | 6.35E−02 | 175.6 |
| 1.00E−02 | 7.92E−02 | 1.11E−01 | 18.0 | 14.9 | −9.0 | −9.1 | 6.35E−02 | 176.2 |
| 5.00E−02 | 3.94E−01 | 5.53E−01 | 17.9 | 14.9 | 4.9 | 4.9 | 6.40E−02 | 176.3 |
| 1.00E−01 | 7.75E−01 | 1.09E+00 | 17.8 | 14.7 | 10.8 | 10.7 | 6.58E−02 | 176.0 |
| 1.50E−01 | 1.11E+00 | 1.56E+00 | 17.4 | 14.3 | 14.0 | 13.9 | 6.83E−02 | 174.9 |
| 2.00E−01 | 1.37E+00 | 1.92E+00 | 16.7 | 13.6 | 15.7 | 15.7 | 7.08E−02 | 172.6 |
| 2.50E−01 | 1.53E+00 | 2.15E+00 | 15.8 | 12.7 | 16.7 | 16.7 | 7.24E−02 | 171.3 |
| 3.00E−01 | 1.63E+00 | 2.28E+00 | 14.7 | 11.6 | 17.2 | 17.2 | 7.33E−02 | 170.7 |
| 3.50E−01 | 1.69E+00 | 2.37E+00 | 13.7 | 10.6 | 17.5 | 17.5 | 7.41E−02 | 170.2 |
| 4.00E−01 | 1.73E+00 | 2.43E+00 | 12.7 | 9.6 | 17.8 | 17.7 | 7.51E−02 | 169.9 |
| 4.50E−01 | 1.76E+00 | 2.47E+00 | 11.9 | 8.8 | 17.9 | 17.9 | 7.61E−02 | 169.6 |
| 5.00E−01 | 1.79E+00 | 2.51E+00 | 11.1 | 8.0 | 18.1 | 18.0 | 7.72E−02 | 169.5 |
| 5.50E−01 | 1.81E+00 | 2.55E+00 | 10.4 | 7.3 | 18.2 | 18.1 | 7.82E−02 | 169.3 |
| 6.00E−01 | 1.83E+00 | 2.57E+00 | 9.7 | 6.6 | 18.3 | 18.2 | 7.93E−02 | 169.2 |
| 6.50E−01 | 1.85E+00 | 2.60E+00 | 9.1 | 6.0 | 18.4 | 18.3 | 8.03E−02 | 169.1 |
| 7.00E−01 | 1.87E+00 | 2.62E+00 | 8.5 | 5.4 | 18.4 | 18.4 | 8.13E−02 | 169.1 |
| 7.50E−01 | 1.88E+00 | 2.64E+00 | 8.0 | 4.9 | 18.5 | 18.4 | 8.22E−02 | 169.0 |
| 8.00E−01 | 1.89E+00 | 2.65E+00 | 7.5 | 4.4 | 18.5 | 18.5 | 8.31E−02 | 169.0 |

Figure 7A:
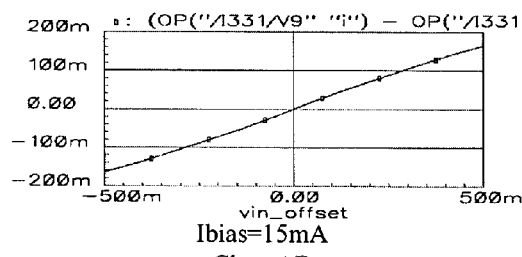
FIG. 7A and 7B are charts illustrating the operation of the PAD in Class AB mode at bias current of 15 mA per branch.
Figure 7B:
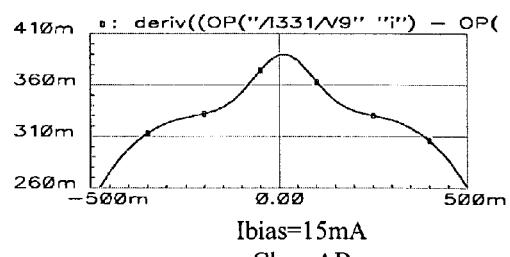

FIG. 7A and 7B are charts illustrating the operation of the PAD 250 in Class AB mode at 15 mA per branch. Specifically, FIG. 7A is a chart illustrating differential output current (y axis) versus differential input voltage (x axis) and FIG. 7B is a chart illustrating the first derivative of the chart of 7A indicating linearity. Biasing the PAD 250 with less than 30 mA requires that the differential pair be driven harder to achieve output power of 15 dBm compared to a Class A case. As can be seen in FIG. 7B, the derivative in FIG. 7B shows improved input linearity range with less change in the slope compared to the Class A configuration in FIG. 6B. This enables the design to handle the extra input swing for 15 dBm output without degrading the output 1 dB compression point. There will be some instances in which bias current for the PAD 250 is 0—i.e., the PAD 250 is off occasionally.

Figure 8A:
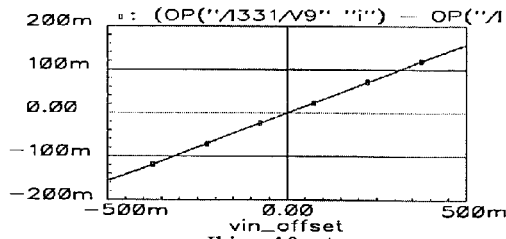
FIG. 8A and 8B are charts illustrating the operation of the PAD in Class AB mode at bias current of 10 mA per branch.
Figure 8B:
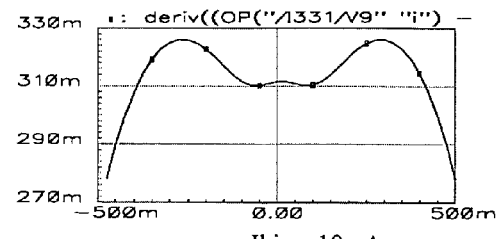

FIG. 8A and 8B are charts illustrating the operation of the PAD 250 in Class AB mode at 10 mA per branch. Specifically, FIG. 8A is a chart illustrating differential output current (y axis) versus differential input voltage (x axis) and FIG. 8B is a chart illustrating the first derivative of the chart of 8A indicating linearity. As can be seen in FIG. 8B, input linearity range is much improved over 15 mA in Class AB and 30 mA in Class A. This enables the design to handle the extra input swing for 15 dBm output without degrading the output 1 dB compression point. The table below shows the linearity of the output versus input voltage at 10 mA.

250 is presented (920). In an embodiment of the invention, the load R=50 Ohms. The maximum power out is then measured (930) to be equal (930) to about $V^2/R$. It is then determined (940) if the maximum linear power out meets a 1 dB compression point a margin (e.g., 15 dB plus a 1 dB margin) by comparing the power out to the desired value (e.g., 16 dB). If this is the last load, the largest load that meets the design requirement is selected (970). Otherwise, additional loads are tested by changing (960) the load and repeating the presenting (920) to determining (940). The method 900 then ends.

Figure 10:
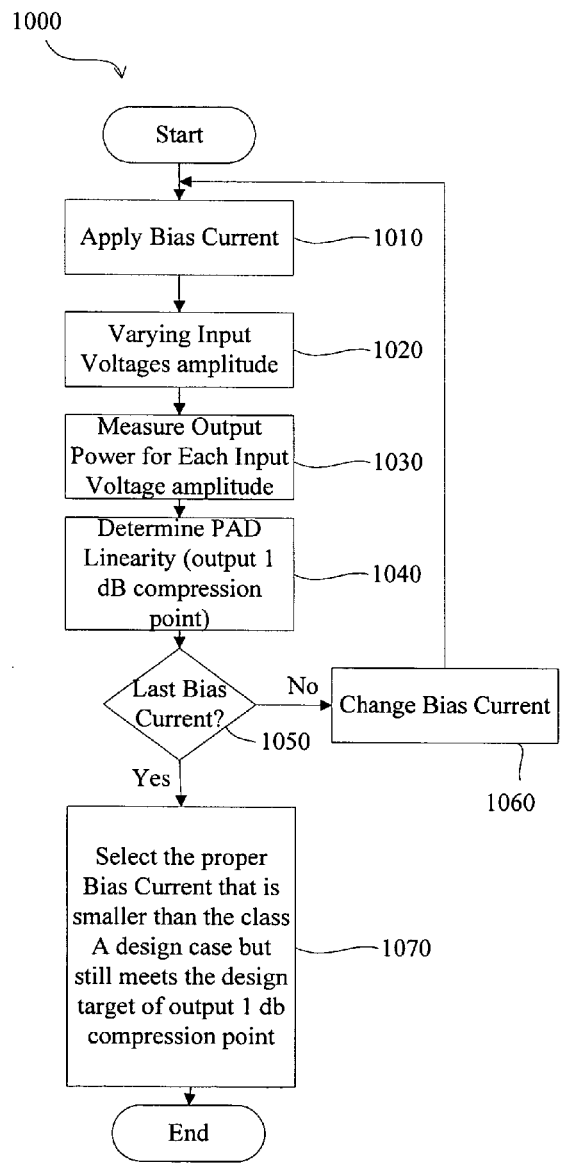
FIG. 10 is a flowchart illustrating a method of determining if the PAD meets the design target of output 1 dB compression point 15 dBm at bias current smaller than the class A design case.

FIG. 10 is a flowchart illustrating a method 1000 of determining if the PAD meets the design target of output 1 dB compression point 15 dBm at bias current smaller than the class A design case. After the load is chosen as described

TABLE II

Linearity at 10 mA/Class AB

| in_mv | pa_mv | vout_mv | pa_gain_db | vout_gain_db | pa_dbm | vout_dbm | idc_mA | phase |
|---|---|---|---|---|---|---|---|---|
| 1.00E−03 | 4.67E−03 | 6.56E−03 | 13.4 | 10.3 | −33.6 | −33.7 | 2.32E−02 | 172.2 |
| 1.00E−02 | 4.68E−02 | 6.56E−02 | 13.4 | 10.3 | −13.6 | −13.7 | 2.32E−02 | 172.7 |
| 5.00E−02 | 2.34E−01 | 3.28E−01 | 13.4 | 10.3 | 0.4 | 0.3 | 2.41E−02 | 172.9 |
| 1.00E−01 | 4.67E−01 | 6.55E−01 | 13.4 | 10.3 | 6.4 | 6.3 | 2.69E−02 | 173.0 |
| 1.50E−01 | 7.00E−01 | 9.82E−01 | 13.4 | 10.3 | 9.9 | 9.8 | 3.11E−02 | 173.1 |
| 2.00E−01 | 9.31E−01 | 1.31E+00 | 13.4 | 10.3 | 12.4 | 12.3 | 3.65E−02 | 173.2 |
| 2.50E−01 | 1.15E+00 | 1.61E+00 | 13.2 | 10.2 | 14.2 | 14.1 | 4.23E−02 | 172.5 |
| 3.00E−01 | 1.33E+00 | 1.87E+00 | 13.0 | 9.9 | 15.5 | 15.5 | 4.80E−02 | 171.1 |
| 3.50E−01 | 1.48E+00 | 2.08E+00 | 12.5 | 9.4 | 16.4 | 16.3 | 5.29E−02 | 170.1 |
| 4.00E−01 | 1.57E+00 | 2.21E+00 | 11.9 | 8.8 | 16.9 | 16.9 | 5.65E−02 | 169.7 |
| 4.50E−01 | 1.63E+00 | 2.29E+00 | 11.2 | 8.1 | 17.3 | 17.2 | 5.93E−02 | 169.5 |
| 5.00E−01 | 1.68E+00 | 2.36E+00 | 10.5 | 7.4 | 17.5 | 17.4 | 6.16E−02 | 169.4 |
| 5.50E−01 | 1.72E+00 | 2.41E+00 | 9.9 | 6.8 | 17.7 | 17.6 | 6.36E−02 | 169.3 |
| 6.00E−01 | 1.74E+00 | 2.45E+00 | 9.3 | 6.2 | 17.8 | 17.8 | 6.55E−02 | 169.2 |
| 6.50E−01 | 1.77E+00 | 2.48E+00 | 8.7 | 5.6 | 18.0 | 17.9 | 6.71E−02 | 169.1 |
| 7.00E−01 | 1.79E+00 | 2.52E+00 | 8.2 | 5.1 | 18.1 | 18.0 | 6.87E−02 | 169.1 |
| 7.50E−01 | 1.81E+00 | 2.54E+00 | 7.7 | 4.6 | 18.2 | 18.1 | 7.01E−02 | 169.0 |
| 8.00E−01 | 1.83E+00 | 2.57E+00 | 7.2 | 4.1 | 18.3 | 18.2 | 7.15E−02 | 168.9 |

The output 1 dB compression point for this design with bias current=10 mA is now 15.5 dBm which meets the specification but with only approximately one third of class A design bias current is used. Additional current biases can be run to empirically find out all bias possibilities in the class AB region such that output linearity is meeting the specification. Actual comparisons of linearity can be done by computer as is known to those of ordinary skill in the art.

Figure 9:
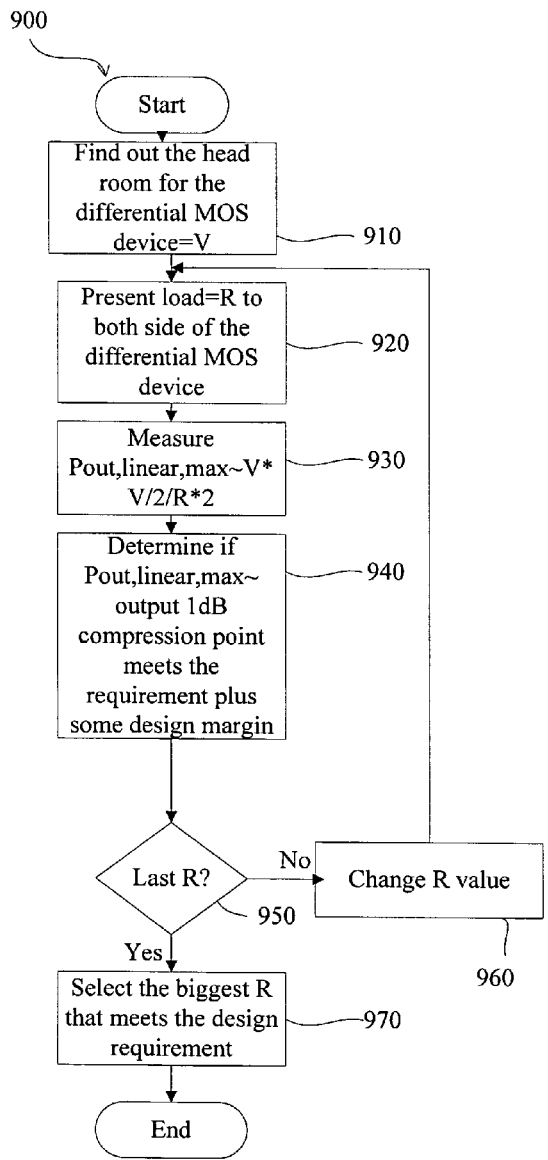
FIG. 9 is a flowchart illustrating a method of finding the load that achieves the required output 1 dB compression point for the power amplifier driver (PAD) when output headroom is the limiting factor.

FIG. 9 is a flowchart illustrating a method 900 of finding the load that achieves the required output 1 dB compression point for the power amplifier driver (PAD) when output headroom is the limiting factor. For the 1.8V TSMC process and power supply of 1.8V, MOS device headroom is about 1.5V, with 50 ohm load, output 1 dB compression point of 16 dBm can be achieved. This leaves 1 dB margin for the design target of 15 dBm. That is why the 50 ohm is chosen as the load for this PAD design. After the load (50 in this design) is determined, the method 900 determines how to bias the differential MOS device(differential pair) of the power amplifier.

First, the head room for the PAD 250 is determined (910). For MOS to behave as a Gm device (output signal current is a linear function of input signal voltage), the drain voltage has to be at least some voltage Vds, sat depends on the bias condition, and process/temperature. Vds,sat is roughly 0.2~0.3 for this application. That means the headroom for the drain of the MOS to swing now becomes 1.8(power supply)−0.3=1.5. Then a load R to both branches of the PAD in method 900, the method 1000 finds the bias current level that meets the above design goal and confirms if it can be accomplished with much less current(class AB design). First, a bias current is applied (1010) to the PAD (e.g., the PAD 250). Then, varying voltage amplitudes are inputted (1020) to the PAD. Output power for each voltage input is measured (1030) and ouput 1 dB compression point is determined (1040) by finding the point where real output power is lower than the expected linear output power by 1 dB. This test will capture all the effects that degrades the linearity including input non-linearity, output headroom, etc. If (1050), this is the last bias current to be tested, then a bias current less than the bias current in a Class A design (e.g., 30 mA/branch) but meets the design target (e.g, 16 dB) is selected (1070). (The determining (940; FIG. 9) is to figure out the relationship between output 1 dB compression point to the load resistance plus the power supply if the device non-linearity is out of the picture and the device headroom is the only limiting factor to limit the output 1 dB compression point. For 50 ohm/1.8V power supply, ideal MOS (GM) device, we should get 16 dBm. After this, the method 1000 confirms that the real PAD under different bias condition meets requirements, the design still meets the 15 dBm output 1 dB compression point design target.) Otherwise, the bias current is changed and the applying (1010) through the determining (1040) is repeated until all bias currents are tested. The method 1000 then ends.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. An amplifier, comprising:
    a differential pair;
    a pair of differential inductor coupled to the differential pair and to a power supply,
    wherein the pair of differential inductor is not matched to a load; and
    wherein the differential pair includes a pair of bias transistor supplying a pair of current to bias the amplifier in a Class AB mode.

2. The amplifier of claim 1, wherein output of the differential pair is combined.

3. The amplifier of claim 1, wherein the amplifier tunes out parasitic capacitance.

4. The amplifier of claim 1, wherein the differential pair includes a positive and a negative branch.

5. The amplifier of claim 4, wherein an electrical equivalent of each branch of the amplifier includes a capacitor interspersed between two unmatched resistors.

6. The amplifier of claim 5, wherein the two unmatched resistors include a 50 Ohm resistor and a 200 Ohm resistor.

7. The amplifier of claim 1, wherein the pair of bias current supplied is selected based on linearity between input voltage and output power of the amplifier.

8. A transmitter having an amplifier according to claim 1.

9. A method, comprising:
    presenting a load to a differential pair of a power amplifier; and
    supplying a pair of bias current to bias the differential pair in a class AB mode;
    wherein the differential pair is coupled to a pair of a differential inductor, which is coupled to a power supply and the pair of differential inductor is not matched to a load.

10. The method of claim 9, further comprising combining the output of the differential pair.

11. The method of claim 9, the power amplifier tunes out parasitic capacitance.

12. The method of claim 9, wherein the differential pair includes a positive and a negative branch.

13. The method of claim 12, wherein an electrical equivalent of each branch of the amplifier includes a capacitor interspersed between two unmatched resistors.

14. The method of claim 13, wherein the two unmatched resistors include a 50 Ohm resistor and a 200 Ohm resistor.

15. The method of claim 9, wherein the pair of bias current supplied is selected based on linearity between input voltage and output power of the amplifier.

16. The power amplifier of claim 1, wherein the load comprises a balun.

17. The method of claim 9, wherein the load comprises a balun.

18. A power amplifier, comprising:
    a pair of difference means for producing a difference;
    a pair of differential inductors means for producing differential inductance coupled to the pair of the difference means and to a power supply means for supplying power,
    wherein the pair of differential inductor means is not matched to a load means for receiving an output from the pair of differential inductor means; and
    wherein the pair of difference means includes a bias switching means for supplying a pair of bias current to bias the power amplifier in a Class AB mode.

19. The amplifier of claim 18, wherein the load means comprises a balun.

* * * * *

UNITED STATES PATENT AND TRADEMARK OFFICE
CERTIFICATE OF CORRECTION

PATENT NO.         : 7,145,390 B2
APPLICATION NO. : 10/953362
DATED                  : December 5, 2006
INVENTOR(S)        : Meng-An Pan It is certified that error appears in the above-identified patent and that said Letters Patent is hereby corrected as shown below:

IN THE CLAIMS:

Please make the following changes:

Col. 9
Claim 1, lines 3 and 5 change "inductor" to --inductors--;

lines 7-8, change "transistor" to --transistors--; and change "current" to --currents--.

Claim 7, line 2 change "current" to --currents--; and change "is" to --are--.

Claim 9, lines 2 and 3 delete "a power" and replace with --power--; change "amplifier" to --amplifiers--;

Col. 10
Claim 9, line 4, change "current" to --currents--; lines 6-7 change "a differential inductor" to --differential inductors--; and change "is coupled" to --are coupled--;

line 8, change "inductor" to --inductors--.

Claim 15, line 2 change "current" to --currents--; and change "is selected" to --are selected--.

Claim 18, line 3, change "inductors" to --inductor--;

lines 4-5, change "the difference" to --difference--;

line 11, change "current" to --currents--.

Signed and Sealed this

Third Day of July, 2007

JON W. DUDAS
*Director of the United States Patent and Trademark Office*